(12) United States Patent
Watkins

(10) Patent No.: US 10,075,135 B2
(45) Date of Patent: Sep. 11, 2018

(54) ENVELOPE MODULATOR

(71) Applicant: KABUSHIKI KAISHA TOSHIBA, Tokyo (JP)

(72) Inventor: Gavin Watkins, Bristol (GB)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 15/021,562

(22) PCT Filed: Sep. 13, 2013

(86) PCT No.: PCT/GB2013/052402
§ 371 (c)(1),
(2) Date: Mar. 11, 2016

(87) PCT Pub. No.: WO2015/036722
PCT Pub. Date: Mar. 19, 2015

(65) Prior Publication Data
US 2016/0226449 A1    Aug. 4, 2016

(51) Int. Cl.
*H03G 3/20* (2006.01)
*H03F 1/02* (2006.01)
*H03F 3/19* (2006.01)
*H03F 3/21* (2006.01)

(52) U.S. Cl.
CPC ............. *H03F 1/0222* (2013.01); *H03F 3/19* (2013.01); *H03F 3/211* (2013.01); *H03F 2200/102* (2013.01); *H03F 2200/451* (2013.01); *H03F 2200/507* (2013.01)

(58) Field of Classification Search
CPC ..... H03F 1/0211; H03F 1/0222; H03F 1/0238

USPC .......................................... 330/127, 136, 297
See application file for complete search history.

(56) References Cited

U.S. PATENT DOCUMENTS

| | | | |
|---|---|---|---|
| 6,710,646 B1 | 3/2004 | Kimball | |
| 2006/0028271 A1 | 2/2006 | Wilson | |
| 2008/0104432 A1 | 5/2008 | Vinayak et al. | |
| 2010/0250993 A1* | 9/2010 | Drogi | H03C 1/00 713/340 |

FOREIGN PATENT DOCUMENTS

| | | |
|---|---|---|
| GB | 2484475 | 4/2012 |
| GB | 2484475 A | 4/2012 |

OTHER PUBLICATIONS

Mann, S. et al. (2003). "A Hybrid Cartesian Loop and Envelope Modulated PA Linear Transmitter Architecture," *The 14$^{th}$ IEEE 2003 International Symposium on Personal, Indoor and Mobile Radio Communication Proceedings*, Piscataway, NJ, Sep. 7-10, 2003, vol. 2; pp. 2721-2725.

International Search Report dated Jun. 3, 2014, from the European Patent Office for corresponding International Application No. PCT/GB2013/052402; 5 pages.

(Continued)

*Primary Examiner* — Steven J Mottola
(74) *Attorney, Agent, or Firm* — Finnegan, Henderson, Farabow, Garrett & Dunner, L.L.P.

(57) ABSTRACT

In an embodiment an envelope modulator comprises a gain compensated lag-lead network or a gain compensated lead-lag network.

12 Claims, 4 Drawing Sheets

(56) References Cited

OTHER PUBLICATIONS

Written Opinion dated Jun. 3, 2014, from the European Patent Office for corresponding International Application No. PCT/GB2013/052402; 6 pages.

Mann et al., "A Hybrid Cartesian Loop and Envelope Modulated PA Linear Transmitter Architecture," The $14^{th}$ IEEE 2003 International Symposium on Personal, Indoor and Mobile Radio Communication Proceedings (Sep. 2003), pp. 2721-25.

Watkins, "A High Bandwidth Class G Current-Mode Amplifier for Envelope Modulators," High Frequency Electronics (Dec. 2011), pp. 20-24.

Kato et al., "Performance of a Frequency Compensated EER-PA with Memoryless DPD," Proceedings of Asia-Pacific Microwave Conference( 2010), pp. 9-12.

Raab, "Split-Band Modulator for Kahn-Technique Transmitters," IEEE MTT-S Digest (2004), pp. 887-890.

Nujira hot technology-cool products, coolteq.h (Nov. 2011), pp. 1-16.

\* cited by examiner

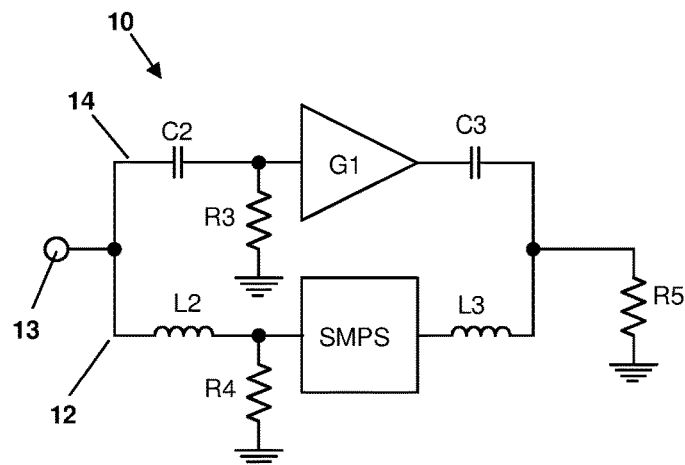
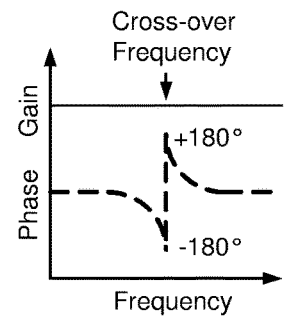
Figure 1a
Figure 1b
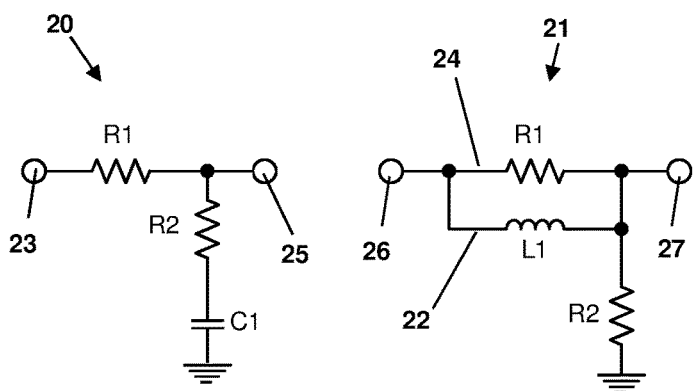
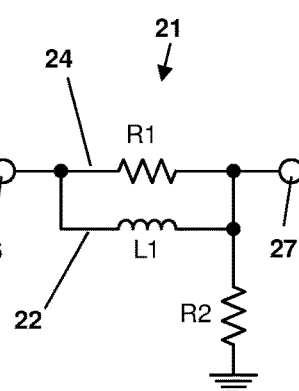
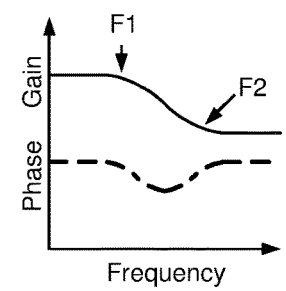
Figure 2a
Figure 2b
Figure 2c
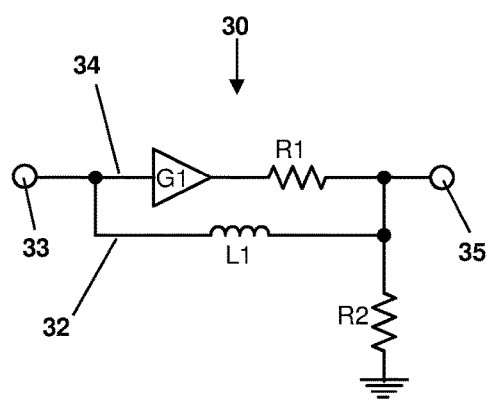
Figure 3

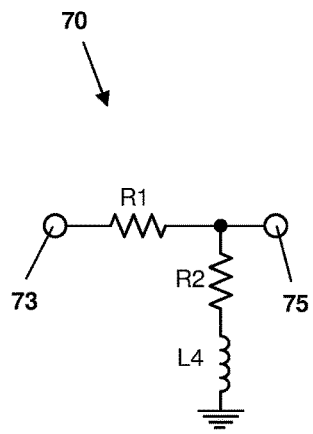
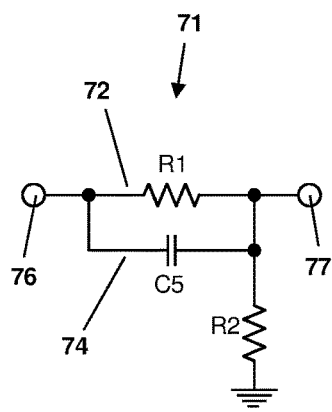
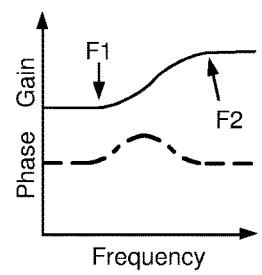
Figure 7a    Figure 7b    Figure 7c
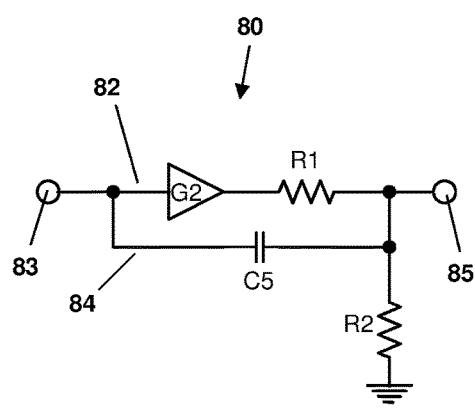
Figure 8

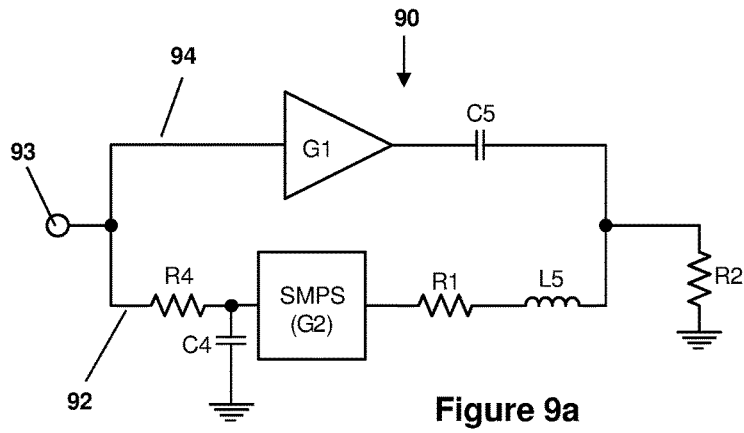
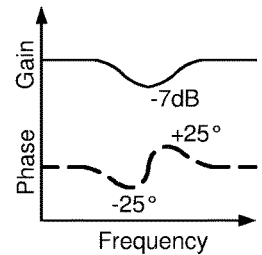
Figure 9a
Figure 9b
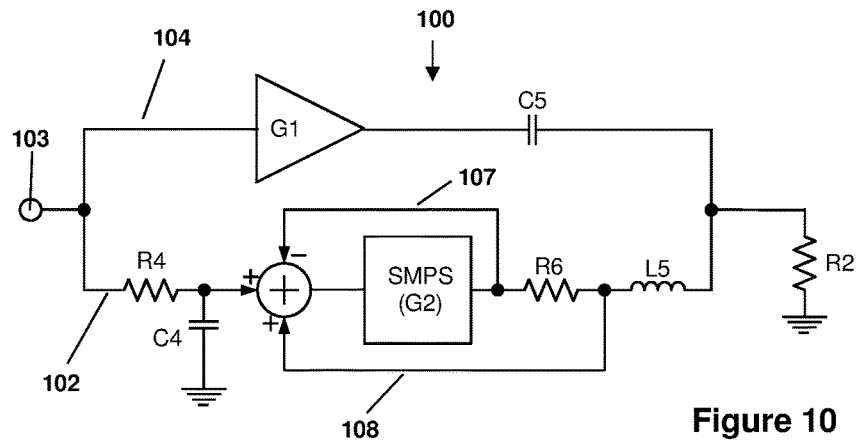
Figure 10
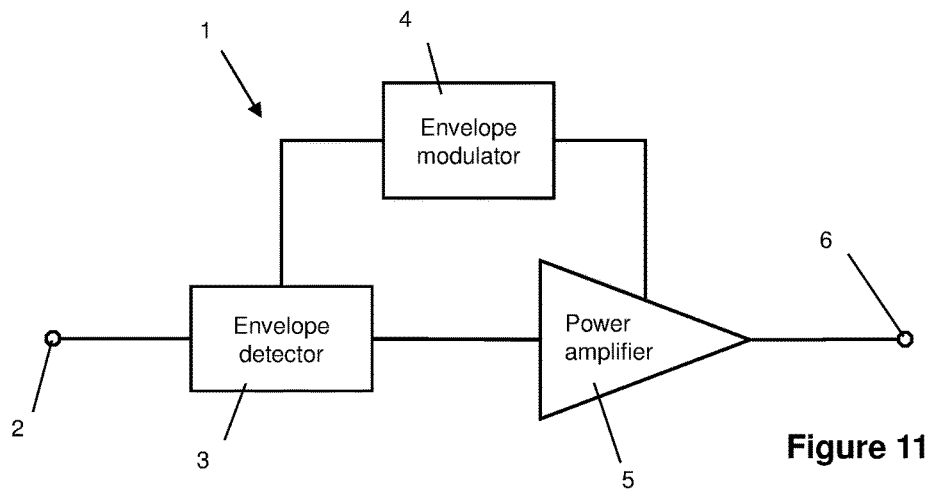
Figure 11

ENVELOPE MODULATOR

FIELD

Embodiments described herein relate generally to envelope modulators, and in particular to split frequency envelope modulators.

BACKGROUND

The technique of envelope modulation is used to increase the efficiency of radio frequency power amplifiers. The supply voltage to the power amplifier is modulated according to the envelope signal of the radio frequency signal. In a split frequency envelope modulator, the envelope signal is split into two parts: a low frequency or DC component and a high frequency or AC component. These two components are amplified separately. The split frequency envelope modulator architecture increases the efficiency of envelope modulation; however, spilt frequency envelope modulators suffer from a phase transient at the cross-over frequency between the low frequency component and the high frequency component.

BRIEF DESCRIPTION OF THE DRAWINGS

Embodiments will be described as non-limiting examples with reference to the accompanying drawings in which:

FIG. 1a shows an envelope modulator;

FIG. 1b shows the frequency response of the envelope modulator shown in FIG. 1a;

FIGS. 2a and 2b show lag-lead networks;

FIG. 2c shows the frequency response of the lag-lead networks shown in FIGS. 2a and 2b;

FIG. 3 shows a gain compensated lag-lead network;

FIG. 4b shows the frequency response of the modulator shown in FIG. 4a;

FIGS. 7a and 7b show lead-lag networks;

FIG. 7c shows the frequency response of the lead-lag networks shown in FIGS. 7a and 7b;

FIG. 8 shows a gain compensated lead-lag network;

FIG. 9a shows an envelope modulator according to an embodiment;

FIG. 9b shows the frequency response of the modulator shown in FIG. 9a;

FIG. 10 shows an envelope modulator according to an embodiment; and

FIG. 11 shows a power amplifier circuit according to an embodiment.

DETAILED DESCRIPTION

Figure 4A:
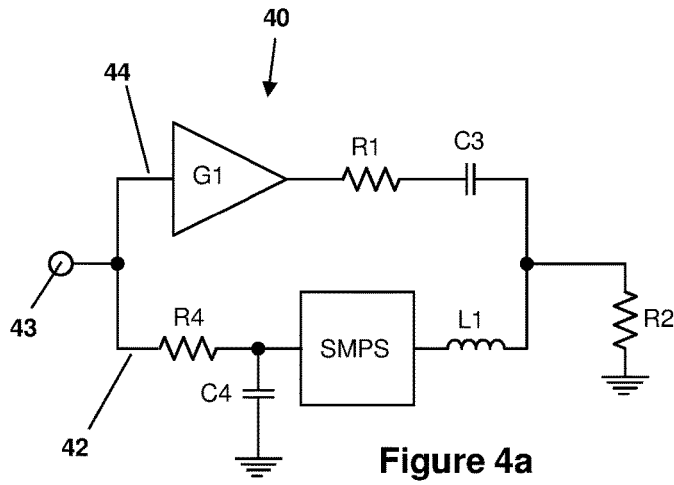
FIG. 4a shows an envelope modulator according to an embodiment.

In one embodiment, an envelope modulator comprises a gain compensated lag-lead network or a gain compensated lead-lag network.

In an embodiment, the envelope modulator comprises a low frequency path configured to amplify components of an input signal having frequencies below a first threshold and a high frequency path configured to amplify components of the input signal having frequencies above a second threshold.

In an embodiment, the first threshold is greater than the second threshold.

In an embodiment, the first threshold is at least five times greater than the second threshold.

In an embodiment, the modulator comprises a lag-lead network and the high frequency path comprises a first impedance and a first amplifier configured to provide gain compensation for the first impedance.

In an embodiment, the first impedance is a synthetic impedance.

In an embodiment, the modulator comprises a lead-lag network and the low frequency path comprises a second impedance and a second amplifier configured to provide gain compensation for the second impedance.

In an embodiment, the second impedance is a synthetic impedance.

In an embodiment, the second amplifier is a switched mode power supply.

In one embodiment a power amplifier circuit comprises a power amplifier configured to amplify an input radiofrequency signal and an envelope modulator as described above and configured to modulate a power supply of the power amplifier according to an envelope of the input radiofrequency signal.

FIG. 1a shows an envelope modulator 10. The modulator 10 is a split frequency modulator comprises a low frequency path 12 and a high frequency path 14 connected in parallel. An input signal is coupled to both the low frequency path 12 and the high frequency path 14 at an input terminal 13.

The low frequency path 12 comprises a switched mode power supply SMPS. A first inductor L2 is connected in the low frequency path 12 between the input terminal 13 and the switched mode power supply SMPS. A resistor R4 is connected between the input of the switched mode power supply SMPS and ground. The first inductor L2 and the resistor R4 together form an input low pass filter. A second inductor L3 is connected between the output of the switched mode power supply SMPS and a load R5.

The high frequency path 14 comprises an amplifier G1. A first capacitor C2 is connected in the high frequency path 14 between the input terminal 13 and the amplifier G1. A resistor R3 is connected between the input of the amplifier G1 and ground. The first capacitor C2 and the resistor R3 form an input high pass filter. A second capacitor C3 is connected between the output of the amplifier G1 and the load R5.

In use, the modulator 10 modulates the supply voltage of a power amplifier according to an envelope signal. The switched mode power supply SMPS in the low frequency path 12 amplifies DC and low frequency components of the envelope signal. The amplifier G1 in the high frequency path amplifies high frequency components or AC components of the envelope signal.

When the modulator is used in an envelope modulated radiofrequency amplifier the load R5 represents the power amplifier. It is assumed that the equivalent impedance of the power amplifier is known, and hence can be represented by a resistor.

FIG. 1b shows the frequency response of the envelope modulator shown in FIG. 1a. As shown in FIG. 1b, the gain response is flat with respect to frequency. This is based on the assumption that both the input filters and output filters of both the low frequency path and the high frequency path have the same cut-off frequency. However, as shown in FIG. 1b, there is a large phase transient at the cross-over frequency. At frequencies below the cross-over frequency the output signal is dominated by the response of the low frequency path. At frequencies above the cross-over frequency the output signal is dominated by the response of the high frequency path.

The phase transient shown in FIG. 1b where the phase flips from −180 degrees to +180 degrees is due to the low frequency path and the high frequency path working against each other in the cross-over region.

FIG. 2a shows a lag-lead network 20. The lag-lead network 20 is a resistor-capacitor-resistor lag-lead network. The lag-lead network 20 comprises a first resistor R1, a second resistor R2 and a capacitor C1. The first resistor R1 is connected between an input terminal 23 and an output terminal 25. The second resistor R2 and the capacitor C1 are connected in series between the output terminal 25 and ground.

FIG. 2b shows a lag-lead network 21. The lag-lead network 21 is the resistor-inductor-resistor equivalent of the lag-lead network 20 shown in FIG. 2a. The resistor-inductor-resistor lag-lead network 21 comprises a first resistor R1, an inductor L1 and a second resistor R2. The first resistor R1 and the inductor L1 are connected in parallel between an input terminal 26 and an output terminal 27. The second resistor R2 is connected between the output terminal 27 and ground. The lag-lead network 21 may be considered to have a low frequency path 22 and a high frequency path 24. The low frequency path 22 is formed by the inductor L1 which has low impedance for low frequency signals but high impedance for high frequency signals. The high frequency path 24 is formed by the resistor R1 which for high frequency signals has lower impedance than the inductor L1.

The lag-lead networks shown in FIGS. 2a and 2b are low pass lag-lead networks.

FIG. 2c shows the frequency response of the resistor-capacitor-resistor lag-lead network 20 shown in FIG. 2a and the equivalent resistor-inductor-resistor lag-lead network 21 shown in FIG. 2b. Both of the lag-lead networks have the frequency response shown in FIG. 2c.

As shown in FIG. 2c, the lead lag networks 20 & 21 attenuate high frequency signals having a frequency greater than F2 more than low frequency signals having a frequency less than F1. This can be understood by considering the resistor-capacitor-resistor lag-lead network 20 shown in FIG. 2a. For low frequencies the capacitor C1 has high impedance therefore the path from the input terminal 23 to the output terminal 25 dominates over the path from the input terminal 23 to ground through the capacitor C1. For high frequency signals a portion of the input signal will pass through the path to ground via the second resistor R2 and the capacitor C1. Therefore the gain for the lag-lead network 20 is lower for high frequency signals than for low frequency signals. The attenuation of high frequency signals can also be understood by considering the resistor-inductor-resistor lag-lead network 21 shown in FIG. 2b. For low frequencies the impedance of the inductor L1 is low and therefore low frequency signals are not attenuated. For high frequency signals the high frequency path including the resistor R1 dominates, however the resistor R1 does attenuate the high frequency signals. As shown in FIG. 2c, the phase response is relatively flat.

FIG. 3 shows a gain compensated lag-lead network 30. The gain compensated lag-lead network 30 is based on the resistor-inductor-resistor lag-lead network 21 shown in FIG. 2b. The gain compensated lag-lead network 30 comprises a low frequency path 32 and a high frequency path 34 which are connected in parallel between an input terminal 33 and an output terminal 35. The low frequency path 32 comprises an inductor L1. The high frequency path 34 includes an amplifier G1 connected in series between the input terminal 33 and a first resistor R1. A second resistor R2 is connected between the output terminal 27 and ground.

By including the amplifier G1 before the first resistor R1 the high frequency gain can be matched to the low frequency gain. The gain of G1 depends on the ratio of R1 to R2 which are set according to the following formula if equal gain is required for both high and low frequencies:

$$\frac{G1 \times R2}{R1 + R2} = 1$$

The gain compensated lag-lead network 30 has a flat gain and phase response.

FIG. 4a shows an envelope modulator 40 according to an embodiment. The envelope modulator 40 comprises a low frequency path 42 and a high frequency path 44. The low frequency path 42 and the high frequency path 44 are connected in parallel between an input terminal 43 and a load R2.

The low frequency path 42 comprises a resistor R4, a switched mode power supply SMPS and an inductor L1 connected in series. A capacitor C4 is connected between the input of the switched mode power supply SMPS and ground. The capacitor C4 and the resistor R4 form a low pass filter.

The high frequency path 44 comprises an amplifier G1, a resistor R1 and a capacitor C3 connected in series between the input terminal 43 and the load R2.

Comparing FIG. 3 and FIG. 4a, it can be seen that the envelope modulator 40 shown in FIG. 4a may be considered to be the gain compensated lag-lead network 30 shown in FIG. 3 with additional components added. The additional components are the capacitor C3 in the high frequency path, and in the low frequency path, the switched mode power supply SMPS and the low pass filter formed from the resistor R4 and the capacitor C4.

Adding capacitor C3 to gain compensated lag-lead network shown in FIG. 3 to form the envelope modulator 40 shown in FIG. 4a will not greatly change the frequency response if C3 is large enough. Similarly, adding an SMPS and low pass filter composed of R4 and C4 has little effect if their cut-off frequency is above that of L1 (which is equivalent to L3 in FIG. 1a) and the load resistance R2 (equivalent to R5 in FIG. 1a). In FIG. 4a, C3 will form a high pass filter with R1 and R2. It is assumed here that the cut-off frequency of this filter is lower than the cut-off frequency formed by L1 and R2. For example, the cut-off frequency formed by C3, R1 and R2 could be five times lower than that of L1 and R2.

Figure 4B:
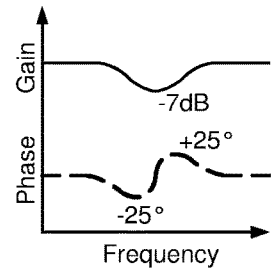

FIG. 4b shows the frequency response of the modulator shown in FIG. 4a. Here it is assumed for simplicity that R1=R2. If R1 is equal to R2, the gain distortion is 7 dB and the phase distortion is 50°. However this does not have to be the case and different values for R1 and R2 may be used.

The addition of R1 in the modulator shown in FIG. 4a improves the frequency response provided G1 has an appropriate gain. Increasing the value of R1 beyond R2 will improve the frequency response further, but the extra loss associated with this will decrease the efficiency of the split frequency envelope modulator (SFEM). By including the resistor R1 the current flowing between the two paths is reduced.

In the applications envisaged for the envelope modulators described the cut off frequency is around 15 kHz. Depending on the architecture the cut off frequency could be anywhere between 100 Hz and 10 MHz.

Figure 5:
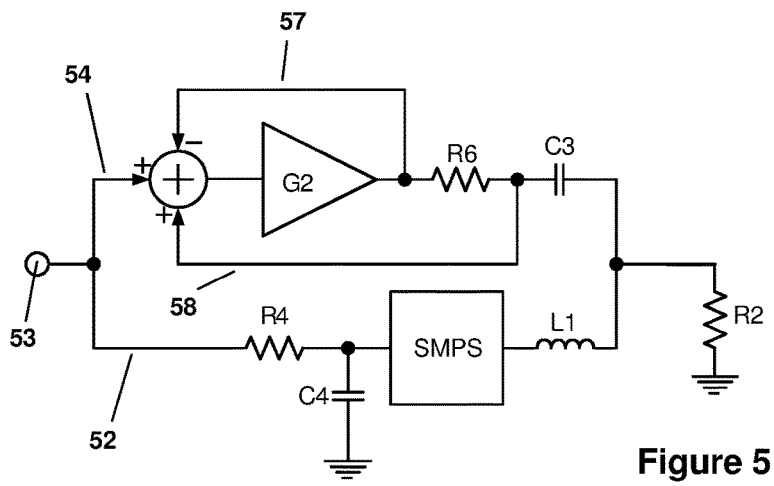
FIG. 5 shows an envelope modulator according to an embodiment.

FIG. 5 shows an envelope modulator 50 according to an embodiment. The envelope modulator 50 comprises a low frequency path 52 and a high frequency path 54 which are connected in parallel between an input terminal 53 and a load R2. The low frequency path 52 is the same as the low frequency path 42 described above in relation to FIG. 4a. The high frequency path 54 includes a synthetic impedance in place of the resistor R1 in FIG. 4a. A synthetic impendence is an impedance that is simulated by the feedback around an amplifier. The synthetic impedance is formed by a resistor R6, an amplifier G2 and the positive and negative feedback.

As shown in FIG. 5, the high frequency path comprises an amplifier G2, the resistor R6 and a capacitor C3 connected in series. Two feedback loops are connected to the input of the amplifier G2. A first feedback loop 57 is connected to the output of the amplifier before the resistor R6. The feedback signal of the first feedback loop is subtracted from the input of the amplifier G2. A second feedback loop 58 is connected to a point between the synthetic impedance R6 and the capacitor C3. The feedback signal of the second feedback loop is added to the input to the amplifier G2.

R6 has a significantly lower value that R1. The feedback around the amplifier G2 makes the resistance of R6 appear to have a higher value. The use of a synthetic impedance improves the efficiency of the envelope modulator 50.

Figure 6:
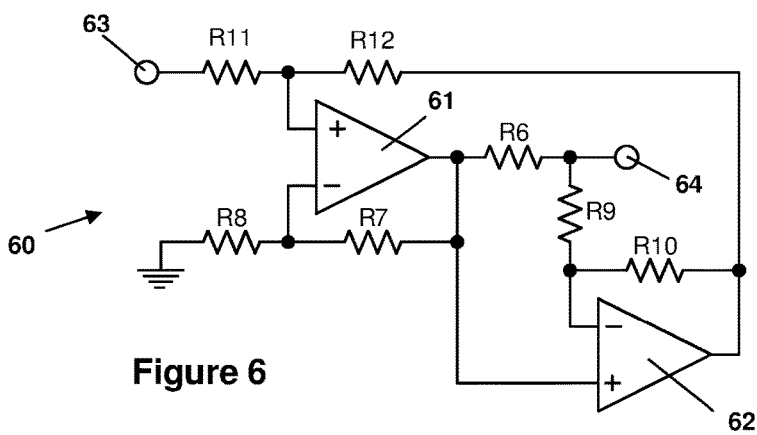
FIG. 6 shows a synthetic impedance circuit.

FIG. 6 shows an example of a synthetic impedance circuit 60 which may be used in embodiments. The synthetic impedance circuit 60 comprises two operational amplifiers 61 & 62 and seven resistors R6-R12 which form connections between the operational amplifiers and an input terminal 63 and an output terminal 64.

Those of skill in the art will appreciate that in embodiments, alternative synthetic impedance circuits to that shown in FIG. 6 may be used.

In the embodiments described above the high frequency path, or the AC path of an envelope modulator includes additional elements. Alternatively, in embodiments the additional elements are included in the low frequency, or DC path. Such embodiments are described below.

FIG. 7a shows a lead-lag network 70. The lead-lag network 70 comprises a first resistor R1, a second resistor R2 and an inductor L4. The first resistor R1 is connected between an input terminal 73 and an output terminal 75. The second resistor and the inductor are connected in series between the output terminal 75 and ground.

FIG. 7b shows a lead-lag network 71. The lead-lag network 71 shown in FIG. 7b is the capacitor equivalent of the high pass lag-lead network 70 shown in FIG. 7a. The lead-lag network 71 comprises a first resistor R1, a second resistor R2 and a capacitor C5. The first resistor R1 and the capacitor C5 are connected in parallel between an input terminal 76 and an output terminal 77. The second resistor R2 is connected between the output terminal 77 and ground. The lead-lag network 71 may be considered to comprise a low frequency path 72 and a high frequency path 74. The low frequency path 72 is through the first resistor R1. The high frequency path 74 is through the capacitor C5. For low frequency signals, the impedance of the capacitor C5 is high so the path through the first resistor R1 dominates. For high frequency signals, the impedance of the capacitor C5 is low so the path through the capacitor C5 dominates.

FIG. 7c shows the frequency response of both the lead-lag network 70 shown in FIG. 7a and the lead-lag network 71 shown in FIG. 7b.

As shown in FIG. 7c, the lead-lag networks 70 & 71 attenuate high frequency signals having a frequency greater than F2 less than low frequency signals having a frequency less than F1. This can be understood by considering the resistor-capacitor-resistor network 71 shown in FIG. 7b. For high frequencies the impedance of the capacitor C5 is low and therefore high frequency signals are not attenuated. For low frequency signals the low frequency path including the resistor R1 dominates, however the resistor R1 does attenuate the low frequency signals. As shown in FIG. 7c, the phase response is relatively flat.

FIG. 8 shows a gain compensated high pass lead-lag network 80. The gain compensated high pass lag-lead network 80 comprises a low frequency path 82 and a high frequency path 84. The low frequency path 82 and the high frequency path are connected in parallel between an input terminal 83 and an output terminal 85. The high frequency path 84 comprises a capacitor C5 which is the same as the high frequency path 74 of the lead-lag network 71 shown in FIG. 7b. The low frequency path 82 comprises an amplifier G2 connected in series with a first resistor R1. A second resistor is connected between the output terminal 85 and ground.

The amplifier G2 compensates for the decreased gain of the low frequency path and allows the low frequency gain to be matched to the high frequency gain. The gain of G2 depends on the ratio of R1 to R2 which are set according to the following formula if equal gain is required for both high and low frequencies:

$$\frac{G2 \times R2}{R1 + R2} = 1$$

The gain compensated lag-lead network 80 has a flat gain and phase response.

FIG. 9a shows an envelope modulator 90 according to an embodiment. The envelope modulator 90 is based on the gain compensated high pass lead-lag network 80 shown in FIG. 8. The envelope modulator 90 comprises a low frequency path 92 and a high frequency path 94 which are connected in parallel between an input terminal 93 and an output load R2.

The low frequency path 92 comprises a first resistor R4, a switched mode power supply SMPS, a second resistor R1 and an inductor L5 connected in series. A capacitor C4 is connected between the input of the switched mode power supply SMPS and ground. The capacitor C4 and the first resistor R4 form a low pass filter.

The switched mode power supply SMPS includes a gain G2 to compensate for the presence of the second resistor R1 in the low frequency path. Thus in the envelope modulator 90 shown in FIG. 9a the switched mode power supply SMPS incorporates the gain G2 shown in the gain compensated high pass lag lead network 80 shown in FIG. 8.

The high frequency path 94 comprises an amplifier G1 and a capacitor C5 connected in series.

Adding the amplifier G1 to the high frequency path and the inductor L5 and the low pass filter formed by R4 and C4 to the low frequency path has little effect on the frequency response. As discussed above in relation to FIG. 4a, the values of the components are selected so that the cut off frequency of the high pass filter formed by C5 and R2 is lower than the cut off frequency of the filter formed by R1, L5 and R2. For example, the cut off frequency of C5 and R2 could be 5 times lower than that of R1, L5 and R2.

FIG. 9b shows the frequency response of the envelope modulator 90 shown in FIG. 9a. As discussed above in relation to FIG. 4b, in FIG. 9b it is assumed that R1=R2. In this case as shown in FIG. 9b there is a dip in gain of −7 dB at the cross-over frequency and there is a phase distortion from −25 degrees to +25 degrees around the cross-over frequency.

Here it is assumed for simplicity that R1=R2. If R1 is equal to R2, the gain distortion is 7 dB and the phase distortion is 50°. However this does not have to be the case and different values for R1 and R2 may be used.

As discussed above in relation to FIG. 5, the efficiency can be increased by replacing the resistor R1 with a synthetic impedance.

FIG. 10 shows an envelope modulator 100 according to an embodiment. The envelope modulator 100 is based on the envelope modulator 90 shown in FIG. 9a but the resistor R1 is replaced by a synthetic impedance formed by a resistor R6, an amplifier G2 and the positive and negative feedback.

The envelope modulator 100 comprises a low frequency path 102 and a high frequency path 104 connected in parallel between an input terminal 103 and an output load R2. The high frequency path 104 is the same as the high frequency path 94 of the envelope modulator 90 shown in FIG. 9a.

The low frequency path 102 comprises a first resistor R4, a switched mode power supply SMPS, the resistor R6 and an inductor L5 connected in series. The switched mode power supply SMPS includes a gain G2 to compensate for the presence of the resistor R6. A capacitor C4 is connected between the input of the switched mode power supply SMPS and ground. The capacitor C4 and the first resistor R4 form a low pass filter.

Two feedback loops are connected to the input of the switched mode power supply SMPS. A first feedback loop 107 is connected to the output of the amplifier before the resistor R6. The feedback signal of the first feedback loop is subtracted from the input of the switched mode power supply SMPS. A second feedback loop 108 is connected to a point between the resistor R6 and the inductor L5. The feedback signal of the second feedback loop is added to the input to the switched mode power supply SMPS. The synthetic impedance may be realised using the circuit shown in FIG. 6.

The two cut-off frequencies of the envelope modulators of embodiments are designed to overlap. The performance reported here is for when R1=R5. This will halve the efficiency of whichever path (AC or DC) it is placed in and reduce overall system efficiency. Reducing the value of R1 relative to R5 increases the magnitude of the phase transient at the crossover frequency. High impedance can be synthesised from R6 as shown in FIG. 5 and FIG. 10 to maintain the linearity, without the loss in efficiency.

FIG. 11 shows a power amplifier circuit 1 according to an embodiment. The power amplifier circuit comprises an input terminal 2, an envelope detector 3, an envelope modulator 4, a power amplifier 5 and an output terminal 6. The envelope modulator 4 comprises a lag-lead network or a lead-lag network as described above.

In use, a radiofrequency signal to be amplified is applied to the input terminal 2. The envelope detector 3 detects an envelope signal from the radiofrequency input signal. The envelope modulator 4 amplifies the envelope signal and modulates the power supply to the power amplifier 5 according to the envelope signal. The power amplifier 5 amplifies the radiofrequency signal and operates in saturation mode with the power supply voltages setting the envelope of the amplified radiofrequency signal supplied to the output terminal 6.

Modern communication and broadcast systems require a low transmitter error vector magnitude. It has been found that the phase transients such as those shown in FIG. 1b have a higher impact on error vector magnitude than any distortion in the gain response. Hence it is more important to correct for the phase distortion than for any gain distortion. Embodiments described herein allow for the correction of the phase distortion and therefore a large reduction in error vector magnitude with a small number of extra components.

Embodiments described herein have applications in transmitters such as LTE base stations and DVB-T2 transmitters.

When simulated with a 3 MHz bandwidth LTE signal, it has been found that the envelope modulators described herein can almost complete remove phase flip and have a resulting error vector magnitude of 0.91%. The envelope modulators described herein have also been found to improve adjacent channel power ratio (ACPR) by approximately 10 dB.

While certain embodiments have been described, these embodiments have been presented by way of example only, and are not intended to limit the scope of the inventions. Indeed the novel circuits described herein may be embodied in a variety of other forms; furthermore, various omissions, substitutions and changes in the form of methods and apparatus described herein may be made without departing from the spirit of the inventions. The accompanying claims and their equivalents are intended to cover such forms of modifications as would fall within the scope and spirit of the inventions.

The invention claimed is:

1. An envelope modulator comprising:
    a gain compensated lag-lead network;
    a low frequency path configured to amplify components of an input signal having frequencies below a first threshold; and
    a high frequency path configured to amplify components of the input signal having frequencies above a second threshold, wherein
    the high frequency path comprises an amplifier, a resistor, and a capacitor,
    the amplifier, the resistor, and the capacitor are connected in series, and
    the resistor is connected to an output of the amplifier and configured to reduce current flow between the high frequency path and the low frequency path.

2. An envelope modulator comprising:
    a gain compensated lag-lead network;
    a low frequency path configured to amplify components of an input signal having frequencies below a first threshold; and
    a high frequency path configured to amplify components of the input signal having frequencies above a second threshold, wherein
    the low frequency path comprises a first resistor, an amplifier, a second resistor, and an inductor,
    the first resistor, the amplifier, the second resistor, and the inductor are connected in series, and
    the second resistor is connected to an output of the amplifier and configured to reduce current flow between the low frequency path and the high frequency path.

3. An envelope modulator according to claim 2, wherein the amplifier is a switched mode power supply.

4. A power amplifier circuit comprising a power amplifier configured to amplify an input radiofrequency signal and an envelope modulator according to claim 1, configured to modulate a power supply of the power amplifier according to an envelope of the input radiofrequency signal.

5. A power amplifier circuit comprising a power amplifier configured to amplify an input radiofrequency signal and an envelope modulator according to claim 2, configured to modulate a power supply of the power amplifier according to an envelope of the input radiofrequency signal.

6. An envelope modulator according to claim 1, wherein the high frequency path comprises:
 a first feedback loop connected around the amplifier between an input of the amplifier and the output of the amplifier at a first location on the high frequency path between the output of the amplifier and the resistor; and
 a second feedback loop connected around the amplifier between the input of the amplifier and the output of the amplifier at a second location on the high frequency path after the resistor, and
 wherein a first feedback signal from the first feedback loop is subtracted from an input signal to the amplifier, and a second feedback signal from the second feedback loop is added to the input signal to the amplifier.

7. An envelope modulator according to claim 6, wherein the first and the second feedback loops are configured to produce a synthetic impedance.

8. An envelope modulator according to claim 1, further comprising a synthetic impedance circuit configured to make a synthetic impedance of the resistor in the high frequency path larger than an actual resistance of the resistor.

9. An envelope modulator according to claim 8, wherein the amplifier is configured to provide gain compensation for the synthetic impedance.

10. An envelope modulator according to claim 2, wherein the low frequency path comprises:
 a first feedback loop connected around the amplifier between an input of the amplifier and the output of the amplifier at a first location on the low frequency path before the second resistor; and
 a second feedback loop connected around the amplifier between the input of the amplifier and the output of the amplifier at a second location on the low frequency path after the second resistor, and
 wherein a first feedback signal from the first feedback loop is subtracted from an input signal to the amplifier, and a second feedback signal from the second feedback loop is added to the input signal to the amplifier.

11. An envelope modulator according to claim 10, wherein the first and the second feedback loops are configured to produce a synthetic impedance.

12. An envelope modulator according to claim 2, further comprising a synthetic impedance circuit configured to make a synthetic impedance of the second resistor in the low frequency path appear larger than an actual resistance of the second resistor.

* * * * *